(12) United States Patent
Yasui et al.

(10) Patent No.: US 9,069,016 B2
(45) Date of Patent: Jun. 30, 2015

(54) CURRENT SENSOR

(71) Applicant: AISIN SEIKI KABUSHIKI KAISHA, Kariya-shi, Aichi-ken (JP)

(72) Inventors: Akihiro Yasui, Kariya (JP); Manabu Kato, Nisshin (JP); Eiichiro Iwase, Toyoake (JP); Ken Okumura, Hekinan (JP); Akira Kamiya, Nagoya (JP)

(73) Assignee: AISIN SEIKI KABUSHIKI KAISHA, Aichi-ken (JP)

( * ) Notice: Subject to any disclaimer, the term of this patent is extended or adjusted under 35 U.S.C. 154(b) by 281 days.

(21) Appl. No.: 13/744,621

(22) Filed: Jan. 18, 2013

(65) Prior Publication Data

US 2013/0187633 A1   Jul. 25, 2013

(30) Foreign Application Priority Data

Jan. 20, 2012   (JP) .................................. 2012-010304

(51) Int. Cl.
*G01R 15/18* (2006.01)
*G01R 15/20* (2006.01)
*G01R 19/20* (2006.01)
*G01R 19/00* (2006.01)

(52) U.S. Cl.
CPC ............ *G01R 19/0092* (2013.01); *G01R 19/20* (2013.01); *G01R 15/185* (2013.01); *G01R 15/207* (2013.01)

(58) Field of Classification Search
CPC .. G01R 15/185; G01R 15/205; G01R 15/202; G01R 15/207; G01R 15/14; G01R 15/20; G01R 19/20; G01R 19/15; G01R 21/06; G01R 31/006; G01R 33/06; G01R 33/07; G01R 33/072; H02K 11/0073; H02K 3/18; H02K 3/522; H02K 41/025; H02K 41/03; H02K 2203/09; H02K 2201/18; H02K 16/02; H02M 7/003; H02M 2001/0009
USPC ................. 324/117 R, 117 H, 225, 177, 127; 323/277; 361/93.1; 335/18
See application file for complete search history.

(56) References Cited

U.S. PATENT DOCUMENTS

| | | | | |
|---|---|---|---|---|
| 3,569,880 | A | * | 3/1971 | Wahlgren ....................... 335/204 |
| 4,011,505 | A | * | 3/1977 | Spalding ................... 324/117 R |
| 4,013,985 | A | * | 3/1977 | Graham et al. .................... 336/5 |

(Continued)

FOREIGN PATENT DOCUMENTS

| | | | | |
|---|---|---|---|---|
| EP | 1074846 A2 | * | 2/2001 | ............. G01R 15/18 |
| JP | 07260831 A | * | 10/1995 | ............. G01R 15/20 |

(Continued)

*Primary Examiner* — Patrick Assouad
*Assistant Examiner* — Sean Curtis
(74) *Attorney, Agent, or Firm* — Sughrue Mion, PLLC

(57) ABSTRACT

A current sensor includes at least three bus bars made of flat-plate-shaped conductors and an inverter, a plurality of cores in which a core is formed by stacking flat plates made of U-shaped magnetic bodies, and a detecting element arranged on the side of an opening portion of each of the cores for detecting the intensity of a magnetic field. An interval between the core and another bus bar that is adjacent to the bus bar inserted into the U groove of the core is ½ of the length of the opening portion in the spacing direction, and the tolerance of the gap is set to a value obtained by subtracting the value of 3/2 of the length of the opening portion in the spacing direction from the value of the interval between the bus bars that are adjacent to each other, with the gap as a median value.

5 Claims, 7 Drawing Sheets

(56) References Cited

U.S. PATENT DOCUMENTS

| | | | | |
|---|---|---|---|---|
| 4,791,361 A | * | 12/1988 | Beihoff et al. | 324/126 |
| 5,283,543 A | * | 2/1994 | Hoffmann | 335/8 |
| 5,734,264 A | * | 3/1998 | Berna et al. | 324/117 H |
| 6,252,389 B1 | * | 6/2001 | Baba et al. | 324/117 H |
| 6,459,255 B1 | * | 10/2002 | Tamai et al. | 324/117 H |
| 6,472,878 B1 | * | 10/2002 | Bruchmann | 324/424 |
| 6,759,840 B2 | * | 7/2004 | Marasch et al. | 324/117 H |
| 7,148,675 B2 | * | 12/2006 | Itoh | 324/117 R |
| 7,205,757 B2 | * | 4/2007 | Itoh et al. | 324/117 R |
| 7,250,749 B2 | * | 7/2007 | Itoh | 324/117 H |
| 7,411,382 B2 | * | 8/2008 | Tanizawa et al. | 324/117 H |
| 7,528,593 B2 | * | 5/2009 | Tanizawa | 324/117 H |
| 8,461,824 B2 | * | 6/2013 | Ausserlechner | 324/126 |
| 8,723,505 B2 | * | 5/2014 | Sakamoto et al. | 324/126 |
| 8,810,235 B2 | * | 8/2014 | Ueno et al. | 324/117 H |
| 2004/0056647 A1 | | 3/2004 | Stauth et al. | |
| 2004/0080308 A1 | * | 4/2004 | Goto | 324/117 H |
| 2006/0043960 A1 | * | 3/2006 | Itoh et al. | 324/117 R |
| 2006/0082357 A1 | * | 4/2006 | Tsukamoto | 324/126 |
| 2006/0087777 A1 | * | 4/2006 | Bruno | 361/38 |
| 2006/0226826 A1 | * | 10/2006 | Teppan | 324/117 H |
| 2007/0063689 A1 | * | 3/2007 | Baker et al. | 324/76.11 |
| 2007/0090825 A1 | * | 4/2007 | Shoji | 324/117 R |
| 2007/0090826 A1 | * | 4/2007 | Itoh | 324/117 R |
| 2007/0096716 A1 | * | 5/2007 | Shoji | 324/117 H |
| 2007/0164727 A1 | * | 7/2007 | Racz et al. | 324/142 |
| 2007/0188946 A1 | * | 8/2007 | Shoji | 360/324.12 |
| 2008/0094060 A1 | * | 4/2008 | Muraki et al. | 324/252 |
| 2008/0094162 A1 | * | 4/2008 | Schaerrer et al. | 336/178 |
| 2008/0129284 A1 | * | 6/2008 | Hu et al. | 324/207.2 |
| 2008/0186021 A1 | * | 8/2008 | Hashio et al. | 324/225 |
| 2009/0128129 A1 | * | 5/2009 | Aratani | 324/117 H |
| 2010/0301835 A1 | * | 12/2010 | Kasajima | 324/117 R |
| 2011/0248711 A1 | * | 10/2011 | Ausserlechner | 324/251 |
| 2011/0288799 A1 | * | 11/2011 | Cortes et al. | 702/65 |
| 2013/0040177 A1 | * | 2/2013 | Hashio et al. | 429/93 |
| 2013/0138372 A1 | * | 5/2013 | Ausserlechner | 702/65 |
| 2014/0176123 A1 | * | 6/2014 | Okumura et al. | 324/127 |
| 2014/0184212 A1 | * | 7/2014 | Yamaguchi et al. | 324/244 |

FOREIGN PATENT DOCUMENTS

| | | | | | |
|---|---|---|---|---|---|
| JP | 08015330 | A | * | 1/1996 | |
| JP | 08194016 | A | * | 7/1996 | G01R 15/20 |
| JP | 2005-345446 | A | | 12/2005 | |
| JP | 2006-071457 | A | | 3/2006 | |
| JP | 2006-112968 | A | | 4/2006 | |
| JP | 2007-171156 | A | | 7/2007 | |
| JP | 2008102116 | A | * | 5/2008 | |
| JP | 2008-151743 | A | | 7/2008 | |
| JP | 2008-220060 | A | | 9/2008 | |
| JP | 2010-014729 | A | | 1/2010 | |
| JP | 2010117165 | A | * | 5/2010 | |
| JP | 2013122400 | A | * | 6/2013 | |
| WO | WO 03046584 | A1 | * | 6/2003 | |
| WO | WO 03056347 | A1 | * | 7/2003 | |

* cited by examiner

CURRENT SENSOR

CROSS REFERENCE TO RELATED APPLICATIONS

This application is based on and claims priority under 35 U.S.C. §119 to Japanese Patent Application 2012-010304, filed on Jan. 20, 2012, the entire content of which is incorporated herein by reference.

TECHNICAL FIELD

This disclosure relates to a current sensor that measures a current that flows through a conductor.

BACKGROUND DISCUSSION

In recent years, hybrid vehicles or electric cars that have a motor as a driving source have been in wide use. It is important to measure a current that flows to the motor when the output of the motor is appropriately controlled. As a method for measuring such a current, for example, there is a method that collects a magnetic field produced around a bus bar according to a current that flows through the bus bar that connects a DC brushless motor and an inverter, using a core made of a magnetic body, detects the magnetic field by a magnetic detecting element, such as a hall element, and calculates and obtains the current that flows through the bus bar on the basis of the detected magnetic field.

On the other hand, in a case where mounting onto hybrid vehicles or electric cars are taken into consideration, a current sensor that measures the current that flows to such a motor requires miniaturization, weight reduction, and multiple connection. By performing miniaturization and multiple connection, the distance between the bus bars that are provided side by side becomes short and the outside dimension of the core also becomes small. Thereby, the linearity of detection sensitivity cannot be ensured or hysteresis characteristics deteriorate. Additionally, disturbance may increase. Thus, techniques described in Patent Documents 1 and 2 that indicate the sources thereof below were studied.

A current sensor described in JP 2008-151743A (Reference 1) is adapted to have a conductor through which a current to be measured flows, an annular magnetic shield plate that is disposed so as to surround the conductor, and has a gap, and a magnetoelectric transducer that is disposed inside the annular magnetic shield plate. The magnetoelectric transducer detects the magnetic flux density of a magnetic field caused by a current. The magnetoelectric transducer is arranged in the vicinity of a position where the magnetic flux density of a magnetic field generated according to a current that flows through the conductor is minimal, between the gap of the annular magnetic shield plate, and the conductor.

A current metering device described in JP 2006-71457A (Reference 2) is adapted to include a magnetic body core, first and second magnetic sensors, and a current detecting circuit. A magnetic body core is arranged so as to surround a current path through which a current flows, and is adapted to include a plurality of gaps. The first and second magnetic sensors are arranged in different gaps, respectively. When the current detecting circuit detects a current that flows through the current path, the residual magnetic flux density of the magnetic body core is corrected from the output of the first magnetic sensor and the output of the second magnetic sensor, to remove an error caused by hysteresis.

A current detecting device described in JP 2006-112968A (Reference 3) is adapted to include a plurality of bus bars through which currents flow, and a plurality of current sensors that detect the currents that flow to the plurality of bus bars. At least some of the plurality of bus bars are provided parallel to each other, and the plurality of current sensors are disposed at positions alternately shifted along the respective bus bars in the bus bars that are provided in parallel.

In the technique described in Reference 1, the magnetoelectric transducer is arranged at a position deviated from a gap end face of the annular magnetic shield plate. Therefore, the effect of increasing the magnetic flux density that the shield plate has, does not reach the inside of the magnetoelectric transducer easily. Therefore, the magnetic flux density to be detected decreases greatly. For this reason, the S/N ratio of the magnetoelectric transducer becomes small. Additionally, since the magnetic flux density decreases, it is necessary to use a high-sensitivity magnetoelectric transducer.

Additionally, in the technique described in Reference 2, two U-shaped magnetic body cores are adapted to have a shape that has two gaps by making opening portions face each other. For this reason, if an external magnetic field is generated, the external magnetic field is collected by the magnetic body core, and the collected magnetic field leads to the opposite magnetic body core through the two gaps. Therefore, a great influence is exerted on the first and second magnetic sensors in the two gaps. In this way, in the technique described in Reference 2, the sensors become susceptible to the external magnetic field.

Additionally, in the technique described in Reference 3, the plurality of current sensors are alternately arranged in a case where detecting parts of the plurality of current sensors, and a magnetic shield are viewed from a position alternately shifted along each bus bar, that is, a direction orthogonal to an extending direction of the bus bar. However, since the magnetic shield is separated from the detecting parts in the shape of Reference 3, the shielding effect is not sufficient. Additionally, in order to enhance the shielding effect, it is necessary to enlarge the magnetic shield in the extending direction of the bus bar. However, in this case, the device will be enlarged.

A need thus exists for a current sensor which is not susceptible to the drawback mentioned above.

SUMMARY

In order to solve the above-described problems, according to an aspect of this disclosure, there is provided a current sensor comprising at least three bus bars that are made of flat-plate-shaped conductors that connect a three-phase motor and an inverter that energizes the three-phase motor and that are provided side by side along a direction parallel to the thickness of the flat plate shape, a plurality of cores in which a core is formed by stacking flat plates made of U-shaped magnetic bodies and in which each of the bus bars is inserted into the inside a U-shaped U groove of the core formed by stacking the flat plates so that the face of the bus bar in a plate width direction and the face of a side wall inside the U-shaped U groove of the core formed by stacking the flat plates become parallel to each other, and a detecting element that is arranged on the side of an opening portion of each of the cores so that a detection direction thereof runs along a spacing direction of the opening portion and detects the intensity of a magnetic field, in which the core is configured so that the interval between the core and another bus bar that is adjacent to the bus bar inserted into the U groove of the core as viewed in the axial direction of the bus bar becomes ½ of the length of the opening portion in the spacing direction, and the tolerance of the gap is set to a value obtained by subtracting the value of 3/2 of the length of the opening portion in the spacing direction from the value of the interval between the bus bars that are adjacent to each other, with the gap as a median value.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Hereinafter, embodiments disclosed here will be described in detail. A current sensor 100 related to this disclosure is configured so as to be capable of measuring a current to be measured that flows through a conductor. Here, in a case where a current flows through the conductor, a magnetic field is generated according to the magnitude of the current with the conductor as an axial center (Ampere's right-hand rule). The present current sensor 100 detects magnetic flux density in such a magnetic field, and measures a current (current value) that flows through the conductor on the basis of the detected magnetic flux density.

Figure 1:
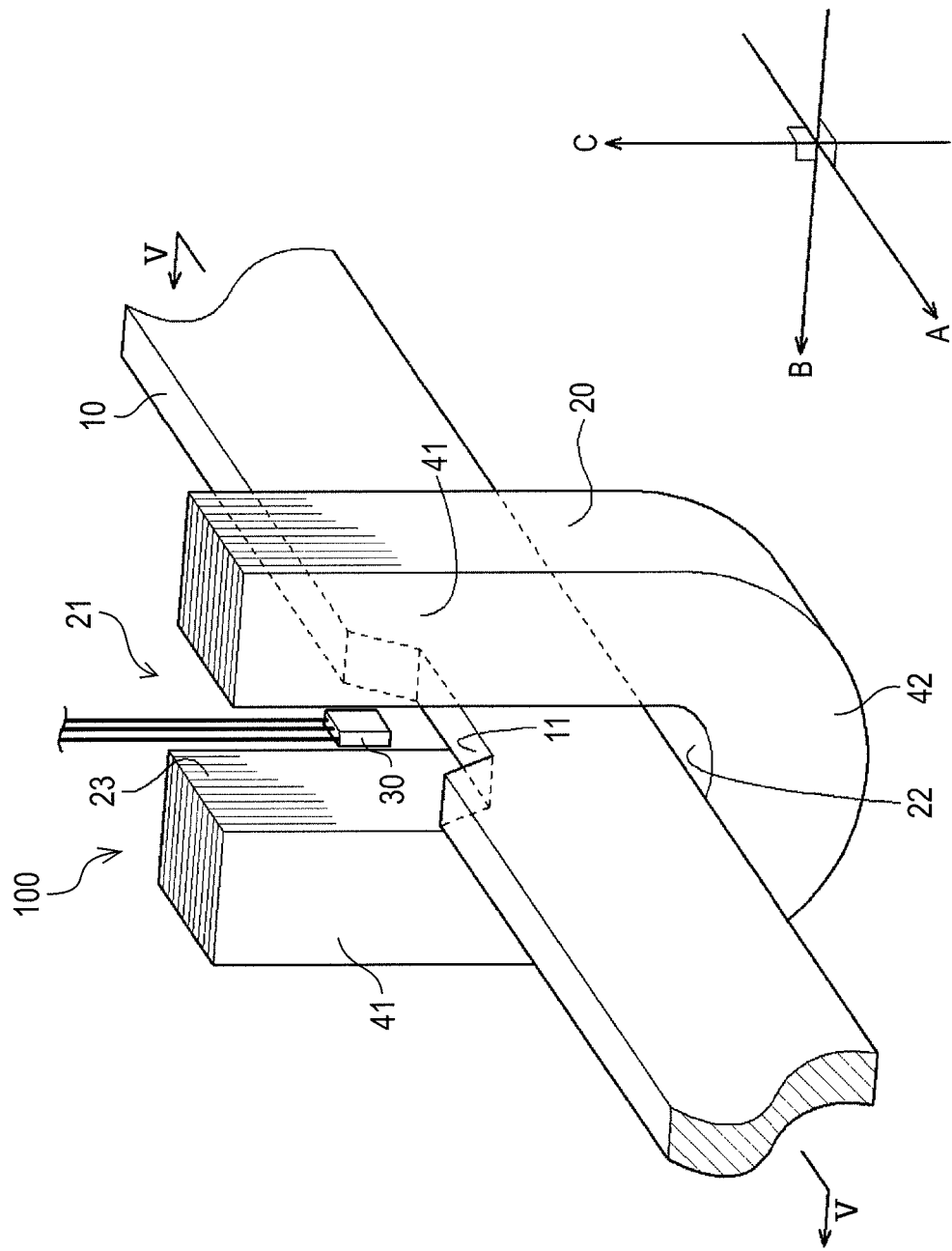
FIG. 1 is a perspective view schematically showing a current sensor according to an embodiment disclosed here.
Figure 2:
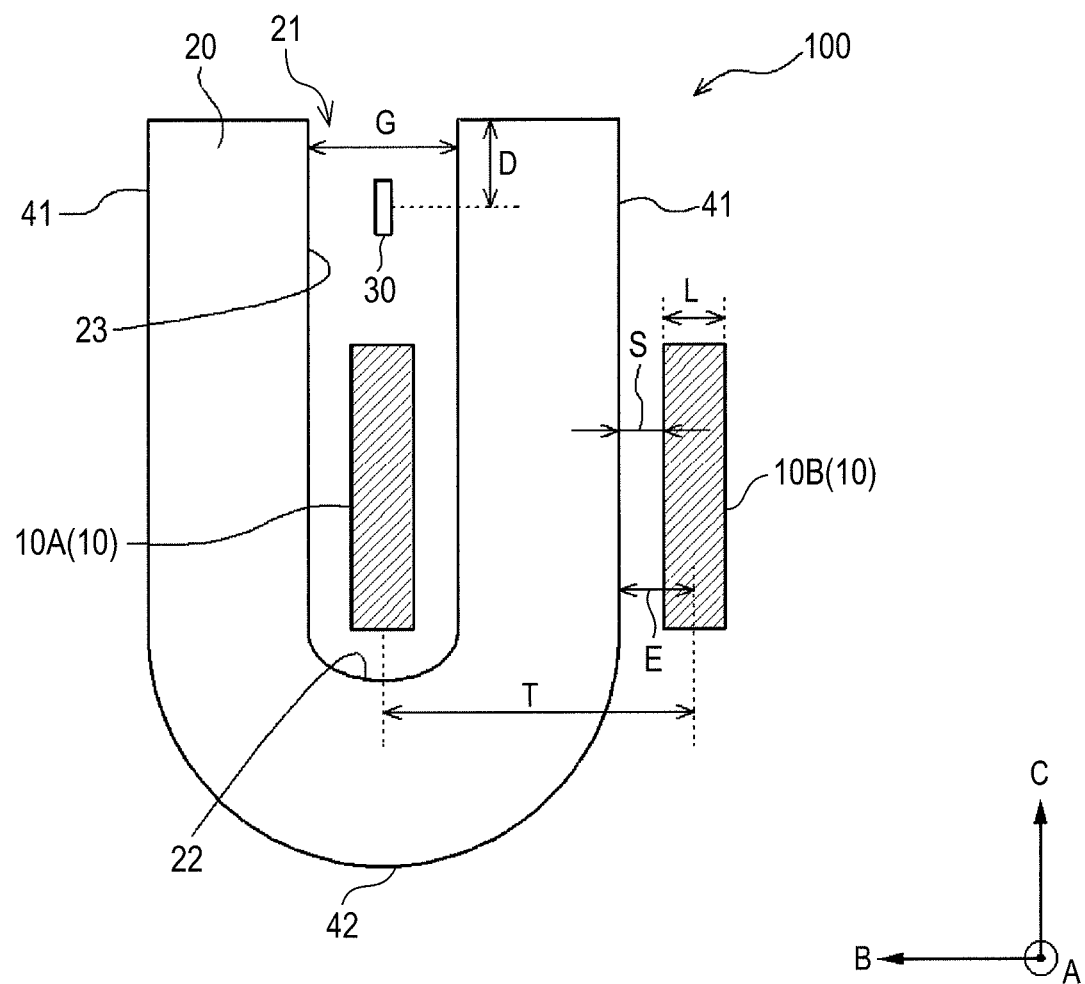
FIG. 2 is a front view schematically showing the current sensor.

A perspective view of the current sensor 100 related to the present embodiment is shown in FIG. 1. Although a bus bar 10 made of a flat-plate-shaped conductor is shown in FIG. 1, a direction in which the bus bar 10 extends is defined as an extending direction A, the thickness direction of the bus bar 10 is defined as B, and the width direction of the bus bar 10 is defined as C. A view schematically showing the current sensor 100 as viewed in the extending direction A of the bus bar 10 is shown in FIG. 2. Hereinafter, description will be made with reference to FIGS. 1 and 2.

The present current sensor 100 is equipped with the bus bar 10, a core 20, and a detecting element 30. The bus bar 10 is made of a flat-plate-shaped conductor as described above. The bus bar 10 is used to connect a three-phase motor (not shown) and an inverter that energizes the three-phase motor. The three-phase motor is used for a power source of a hybrid vehicle, an electric car, or the like. The inverter converts the direct current power output from a battery or the like into alternating current power. The bus bar 10 supplies the electric power converted into alternating current power by such an inverter to the three-phase motor. In addition, although the flow of electric power becomes reverse when being used for power generation like a regenerative brake of the three-phase motor, the configuration is the same as that of the inverter and the three-phase motor.

Figure 3A:
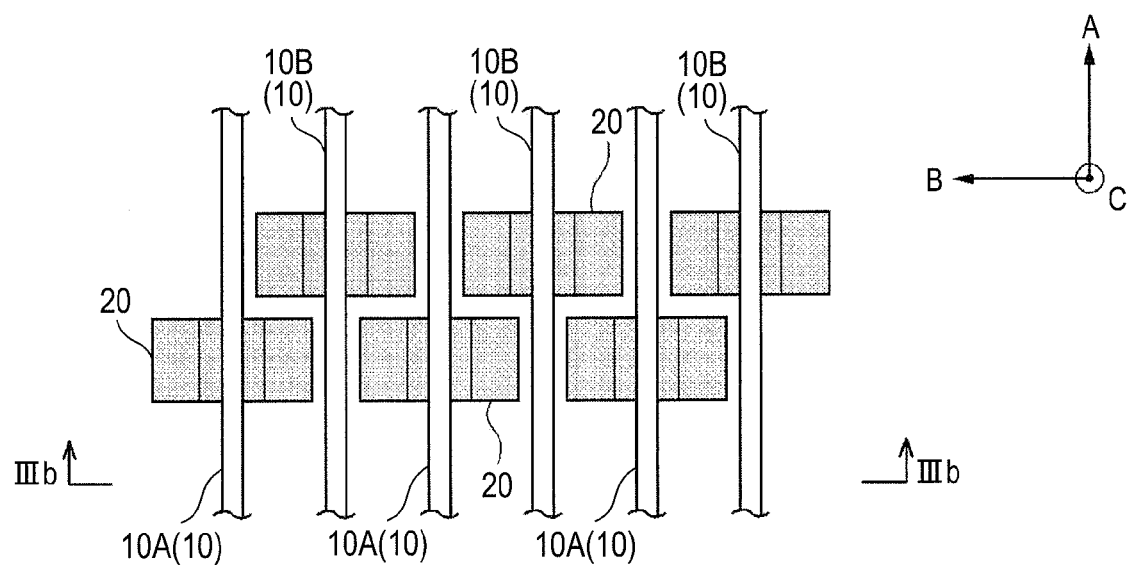
FIGS. 3A and 3B are views schematically showing an example in which the current sensors are disposed in bus bars that are provided side by side.
Figure 3B:
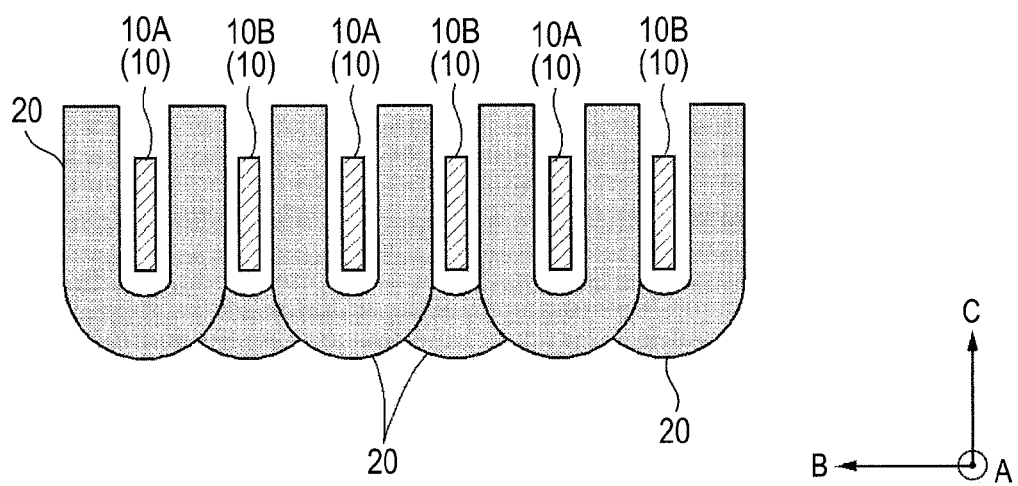

Accordingly, at least three bus bars 10 are provided side by side along a direction (the direction B of FIGS. 3A and 3B) parallel to the thickness of the bus bar 10. A view showing a form in which a plurality of such bus bars 10 are provided side by side is shown in FIGS. 3A and 3B. FIG. 3B is a schematic view as viewed in a direction in which the bus bar 10 extends, and FIG. 3A is a top view of FIG. 3B. As shown in FIGS. 3A and 3B, the cores 20 are alternately arranged in top view of the bus bars 10 so that the core 20 can be arranged in each bus bar 10 even if the interval between the bus bars 10 is short. That is, the cores 20 attached to the bus bars 10 that are adjacent to each other are arranged such that the positions thereof are alternately shifted to the near side and the back side in the extending direction of the bus bars 10. Accordingly, only the bus bars 10 are arranged between the adjacent cores 20, and the cores 20 attached to the bus bars 10 are arranged such that the position thereof are shifted in the extending direction of the bus bars 10.

By arranging the bus bars 10 in this way, it is possible to narrow the pitch of the bus bars 10. In addition, in order to make this disclosure easily understood, one bus bar 10 is shown in FIG. 1 and two bus bars 10 are shown in FIG. 2. A current to be measured, which is measured by the present current sensor 100, flows through such a bus bar 10.

Referring back to FIGS. 1 and 2, the core 20 is formed by stacking flat plates made of a U-shaped metallic magnetic body. The above metallic magnetic body is a soft magnetic metal, and an electromagnetic steel plate (silicon steel plate), Permalloy, Permendur, or the like is equivalent thereto. The stacking plane of the core 20 becomes a plane parallel to a BC plane in FIGS. 1 and 2.

Additionally, in the core 20 related to the present embodiment, as shown in FIGS. 1 and 2, the bus bar is inserted through a U-groove bottom portion 22 side that forms a U-shape such that the face of each bus bar 10 parallel to an AC plane and the face of a U-groove side wall 23 of the core 20 are parallel to each other and the stacking direction of the core and the flow direction of a current to be measured are made to coincide with each other. The bus bar 10 inserted through the core 20 is configured so as to have at least a gap with the inner surface of the core 20. This enables the core 20 and the bus bar 10 to be insulated from each other. Additionally, as described, a plurality of the bus bars 10 are provided, and accordingly, a plurality of the cores 20 are also provided (refer to FIG. 3).

Additionally, the core 20 is configured such that the area (cross-sectional area of a bottom portion 42) of the cross-section of the core 20 that intersects a plane parallel to the AC plane passing through the center of the bus bar 10, among constituent parts of the core 20, is wider than one area (cross-sectional area of a side wall portion 41) of the cross-section of the core 20 that intersects a plane parallel to an AB plane passing through the bus bar 10. A part that is most likely to cause magnetic saturation in the magnetic body is the bottom portion 42 where the magnetic flux in the core increases. Additionally, as the cross-sectional area of the side wall portion 41 is larger, the magnetic flux density of the bottom portion 42 becomes higher. Accordingly, by making the cross-sectional area of the side wall portion 41 smaller until the magnetic flux density in the core, of the side wall portion 41 becomes equal to that of the bottom portion 42, miniaturization can be made, the magnetic flux density of the bottom portion 42 can be kept low, and the magnetic saturation can be suppressed.

The detecting element 30 is arranged on the side of a U-shaped opening portion 21 so that a detection direction runs along the spacing direction (the direction B) of the opening portion 21. The opening portion 21 is an opening end portion of the U groove. For this reason, the detecting element 30 is arranged on the side closer to the opening end portion of the U groove than the bus bar 10. Additionally, a gap is provided between the detecting element 30 in the U groove of the core 20 and the bus bar 10. This enables the detecting element 30 and the bus bar 10 to be insulated from each other. Here, a magnetic field generated according to a current that flows through the bus bar 10 is collected in the core 20. The collected magnetic field becomes a magnetic field in the spacing direction of the opening portion 21 of the core 20 in the vicinity where the detecting element 30 is arranged.

The detecting element 30 is arranged such that the detection direction is made to coincide with the direction B. Accordingly, it is possible to effectively detect the strength of a magnetic field formed by a current to be measured that flows through the bus bar 10.

Here, since a demagnetizing field (a magnetic field generated inside according to the magnetization of the core 20 so as to cancel the magnetization of the core 20) resulting from the holding force of the magnetic body that constitute the core 20 and the shape of the core 20 influences, the hysteresis detected by the detecting element 30 can be reduced by increasing the demagnetizing field. On the other hand, if the permeance coefficient Pc is small, the demagnetizing field becomes large. The permeance coefficient Pc of a magnetic circuit formed by a gap portion including the detecting element 30 and the core 20 is shown by the following Expression (1). The hysteresis, which is one of detection errors, means a magnetic field detected by the detecting element 30 when the current has returned to zero after energization to the bus bar 10.

[Expression 1]

$$Pc = \frac{Lm}{Am} \times \frac{\mu_0 \cdot Ag}{Lg} \times \frac{\sigma}{f} \quad (1)$$

Here, Am is the cross-sectional area of the core, Ag is the cross-sectional area of the gap, Lm is the magnetic path length of the core, Lg is gap length, f is a magnetomotive force loss factor, σ is a leakage coefficient, and $\mu_0$ is the permeability of the gap portion.

Figure 4A:
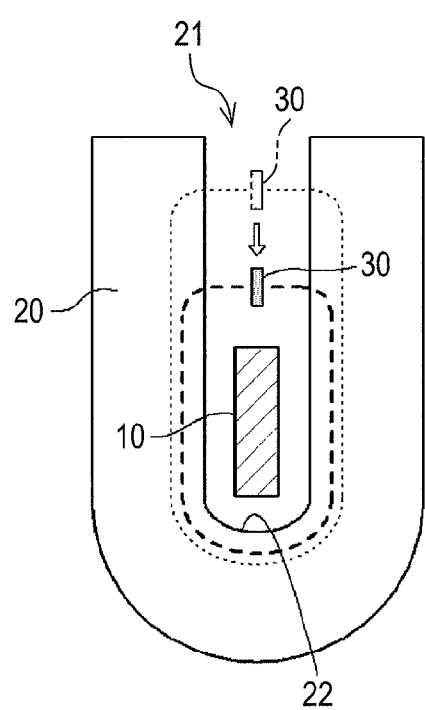
FIGS. 4A and 4B are views schematically showing the advantages of the present current sensor.

From Expression (1), the permeance coefficient Pc becomes small by shortening the magnetic path length Lm. For this reason, since the demagnetizing field can be increased, the hysteresis can be reduced. Accordingly, the hysteresis can be reduced by shortening the magnetic path length that is formed by the core 20 and the detecting element 30 by bringing the detecting element 30 close to the back side of the U groove (refer to FIG. 4A).

Figure 4B:
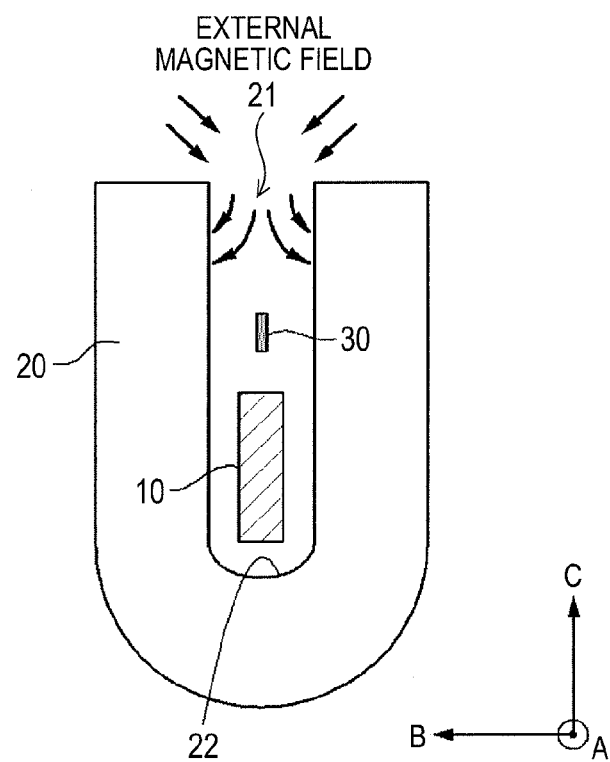

Additionally, since the detecting element 30 moves away from the opening portion 21 of the core 20 by bringing the detecting element 30 close to the U-groove bottom portion 22 (refer to 4A), as shown in FIG. 4B, an external magnetic field can be drawn near to the core 20, thereby reducing the influence on the detecting element 30. By bringing the detecting element 30 close to the back side of the U groove in this way, it is possible to improve the shielding effect against the external magnetic field of the core 20. For this reason, an interval T between the bus bar 10 (10A of FIG. 2) that is a detection target of the detecting element 30 and the adjacent bus bar 10 (10B of FIG. 2) becomes narrow. As a result, even in a case where the intensity of a magnetic field received from the adjacent bus bar 10B becomes strong, it is possible to measure a current that flows through the bus bar 10A with high precision.

Figure 5:
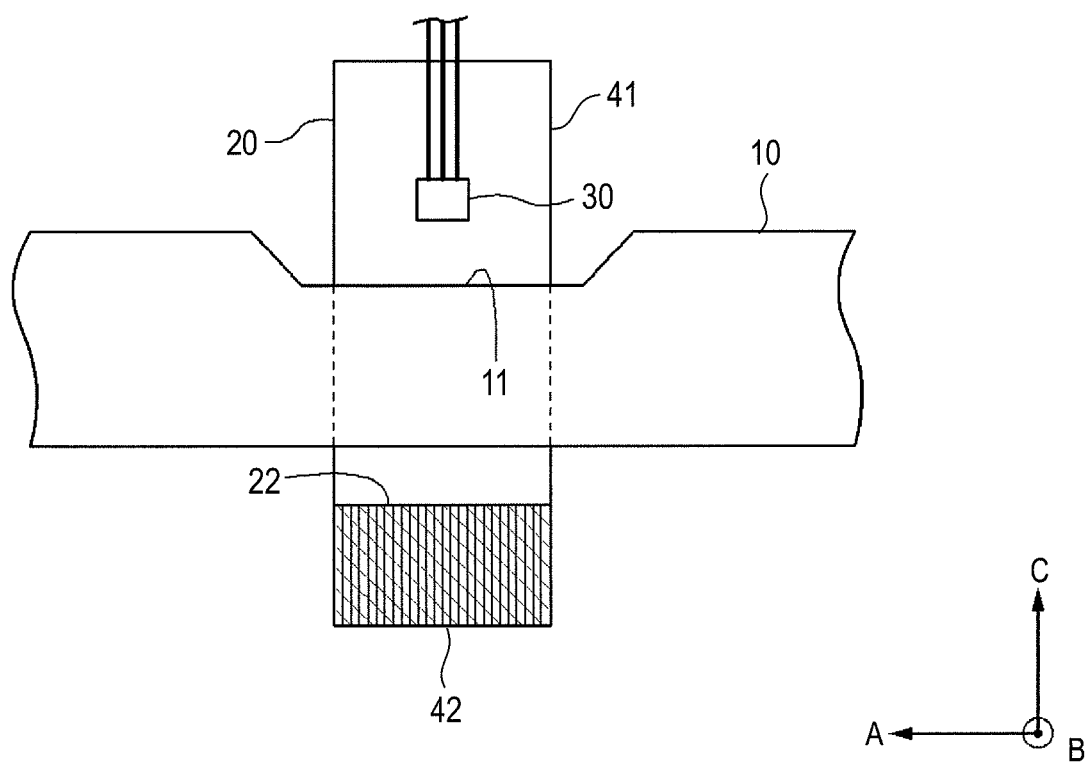
FIG. 5 is a side view of the current sensor.

A cross-sectional view taken along line V-V in FIG. 1 is shown in FIG. 5. As shown in FIG. 5, the bus bar 10 is cut out on the opening portion 21 side of the portion that overlaps the core 20 when the core 20 is viewed in the spacing direction (the direction B in FIG. 1) of the opening portion 21, and a cutout portion 11 is formed. This enables the detecting element 30 to be arranged closer to the back side of the U groove. Accordingly, since the shielding effect is improved even in a case where the interval T becomes narrow and the intensity of a magnetic field received from the adjacent bus bar 10B becomes strong, it is possible to measure a current that flows through the bus bar 10A with high precision. Additionally, since the magnetic path length formed by the core 20 and the detecting element 30 becomes short, the hysteresis can also be reduced.

However, the cross-sectional area of a plane perpendicular to the axial direction of the bus bar 10 or the cutout depth (depth in the direction C in FIG. 3) of the cutout portion 11 is set according to a current that flows through the bus bar 10. That is, this is to prevent heat from being excessively generated due to the electric resistance of the bus bar 10 when a current flows. An increase in the generation of heat by making the cross-sectional area small can be suppressed to the minimum by not making the cross-sectional area the whole bus bar 10 but the cross-sectional area of only the cutout portion 11 small. This enables a current to be measured with high precision while suppressing the heat generation of the bus bar 10.

Additionally, it is preferable if the distance between the bus bar 10 and the inner peripheral surface of the core 20 is shortened. As such a method, for example, a configuration is considered in which the plate width of the core 20 is increased. Since this can shorten magnetic path length and can increase the cross-sectional area of the core 20, it is possible to further enhance the reduction in the effect of hysteresis. Additionally, since the opening portion 21 of the core 20 becomes small, it is possible to further enhance the shielding effect.

Additionally, the following was discovered by the inventor of this disclosure.

It is preferable that the core 20 be formed so that a gap S between the core 20, and another bus bar 10 (10B in FIG. 2) adjacent to a bus bar 10 (10A in FIG. 2) inserted through the U groove of the core 20 as viewed in the axial direction of the bus bar 10 becomes ½ of a length G of the opening portion 21 in the spacing direction B. The gap S between the core 20 and the other bus bar 10B is a gap formed by an external surface of the core 20, and an external surface of the other bus bar 10B that faces the external surface of the core 20. Accordingly, in other words, as viewed in the axial direction of the bus bar 10, it is preferable that the core be configured so that an interval E between the external surface of the core 20 and the central portion of the other bus bar 10B that faces the external surface of the core 20 becomes ½ of the sum of the length G of the opening portion 21 in the spacing direction B and a thickness L of the bus bar 10.

Figure 6:
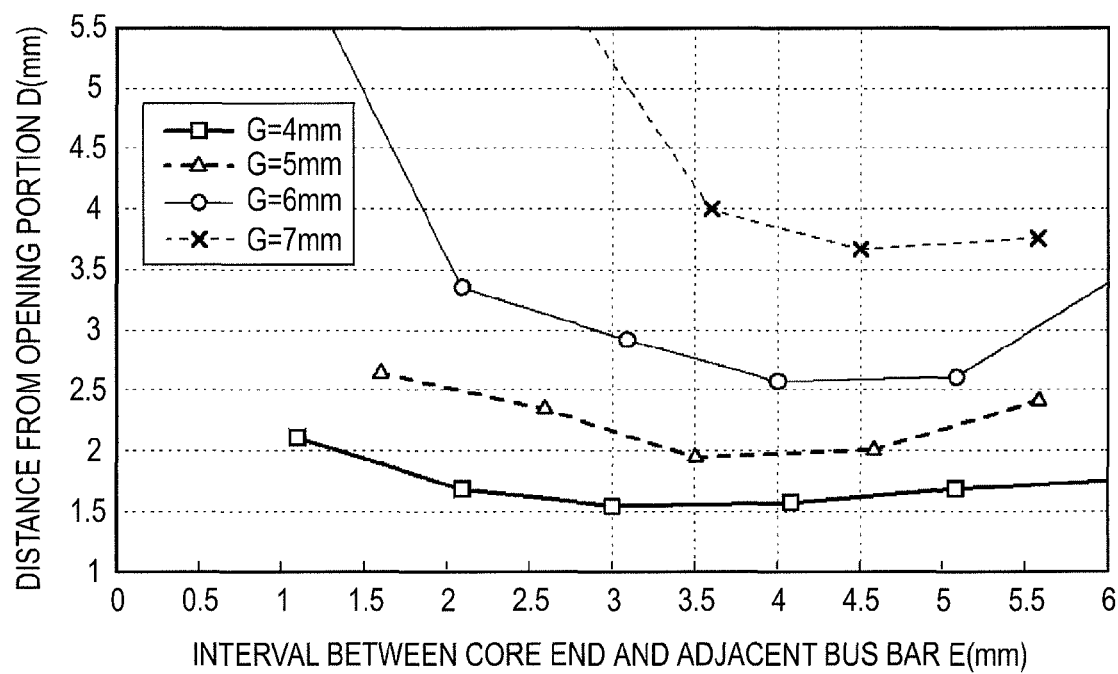
FIG. 6 is a view showing characteristics regarding setting of the size of a core.

The simulation results showing such results are shown in FIG. 6. FIG. 6 is a view showing relationship between the interval E in a case where the length G of the gap is changed and a disturbance influence becomes a fixed ratio, and a distance D from the opening portion 21 to the detecting element 30. That is, the disturbance influence can be made equal to or less than a fixed ratio by designing the distance D of the core 20 greatly than the value of the distance D shown in FIG. 6. However, the plate thickness of the bus bar 10 is 2 mm. Here, the disturbance influence is a detection error received from a magnetic field generated in the bus bar 10 of another phase that is provided in parallel. For example, a value obtained by dividing the "output of the detecting element 30 that detects the magnetic field of the bus bar 10A in a case where only the adjacent bus bar 10B is energized" by the "output of the detecting element 30 that detects the magnetic field of the bus bar 10A when only the bus bar 10A is energized" can be considered as the disturbance influence.

As shown in FIG. 6, if the detecting element is arranged at least at a position where the distance D is equal to or more than 1.5 mm from the opening portion 21 in a case where the length G is 4 mm, the disturbance influence can be kept equal to or less than a fixed ratio. Additionally, if the detecting element is arranged at least at a position where the distance D is about equal to or more than 1.9 mm from the opening portion 21 in a case where the length G is 5 mm, the disturbance influence can be kept equal to or less than a fixed ratio. Additionally, if the detecting element is arranged at least at a position where the distance D is equal to or more than 2.6 mm from the opening portion 21 in a case where the length G is 6 mm, the disturbance influence can be kept equal to or less than a fixed ratio. Similarly, if the detecting element is arranged at least at a position where the distance D is about equal to or more than 3.6 mm from the opening portion 21 in a case where the length G is 7 mm, the disturbance influence can be kept equal to or less than a fixed ratio.

Accordingly, it is preferable if the detecting element 30 is arranged to enter the U-groove bottom portion 22 side that is at least equal to or more than 1.5 mm from the opening portion 21.

Additionally, the followings were found out by the inventor of this disclosure.

Although the preferable value of the gap S has a value that can minimize the disturbance influence within detection errors, since the detection errors also include influence of the hysteresis and the magnetic saturation other than the disturbance influence, a tolerance is given to the preferable value of the gap S so as to cope also with the detection errors other than the disturbance. The tolerance of the gap S is preferable if being set by a value obtained by deducting the value of 3/2 of the length G of the opening portion 21 in the spacing direction B from the value of the interval T of the bus bars 10 (10A, 10B) that are adjacent to each other, with the preferable value of the gap S as a median value.

Figure 7:
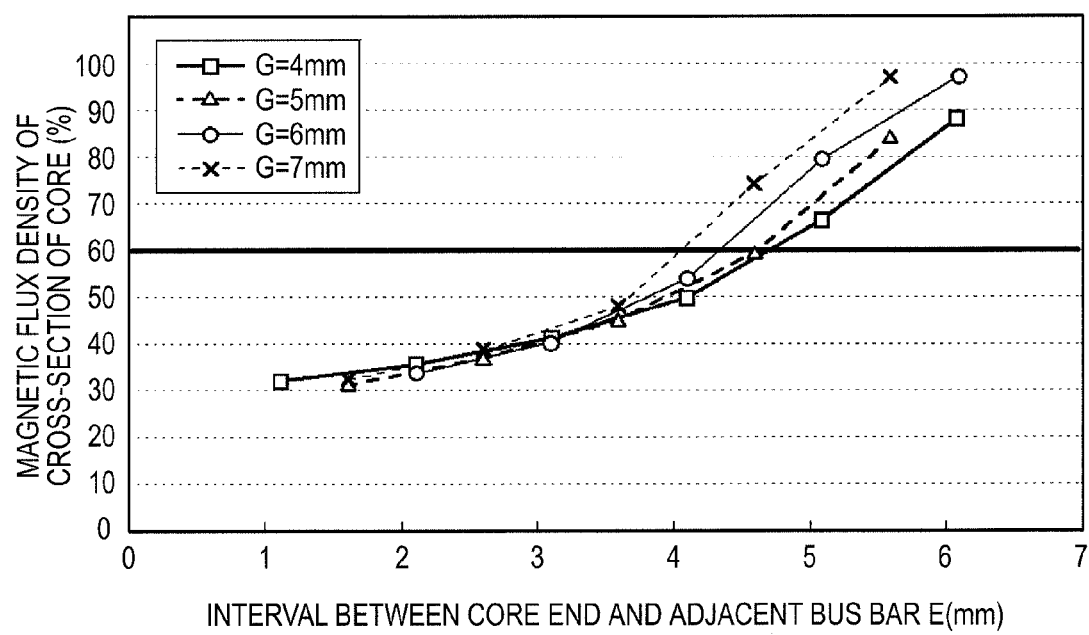
FIG. 7 is a view showing characteristics regarding setting of the size of the core.

FIG. 7 is a view showing the relationship between the interval E and the cross-sectional magnetic flux density of the core 20 in a case where the length G of the gap is changed. Here, the cross-sectional magnetic flux density is a value obtained by averaging the magnetic flux density of a cross-section obtained by cutting the core 20 with a plane orthogonal to the vector of the magnetic flux density passing through the inside of the core 20 in a part where the magnetic flux density of the inside of the core 20 becomes the maximum. If the cross-sectional magnetic flux density of the core 20 becomes high, the core 20 saturates magnetically, and it is impossible to ensure the linearity of a detection value. In FIG. 7, if the tolerance of the cross-sectional magnetic flux density of the core 20 that can ensure linearity is 60% of the saturation magnetic flux density, the maximum tolerances of the intervals E corresponding to the length G of respective gaps in this case are as follows. The interval E becomes 4.8 mm in a case where the length G is 4 mm, the interval E becomes 4.7 mm in a case where the length G is 5 mm, the interval E is 4.4 mm in a case where the length G is 6 mm, and the interval E is 4.1 mm in a case where the length G is 7 mm. If differences from the preferable values of respective intervals E are obtained with respect to these, the interval E becomes 1.8 mm in a case where the length G is 4 mm, the interval E becomes 1.2 mm in a case where the length G is 5 mm, and the interval E is 0.4. mm in a case where the length G is 6 mm. Additionally, since the interval E becomes −0.4 mm in a case where the length G is 7 mm, the tolerance becomes negative, and desired precision cannot be obtained. On the other hand, as is clear from FIG. 6, as the length G of the gap is greater, a change in the distance D to a change in the interval E is greater. From these, the inventor of the present application has found out that high-precision detection can be made in a case where the maximum tolerance of the gap S is set to be smaller than the absolute value of a value obtained by subtracting the value of ¾ of the length G from ½ of the value of the interval T. Additionally, although the above is an upper limit of the interval E, the same applies also to a lower limit. As is clear from FIG. 6, since the distance D becomes greater as the interval E becomes small, the core is enlarged, and detection errors (the hysteresis and the magnetic saturation) other than the disturbance deteriorate. Therefore, the lower limit can also be obtained similarly to the upper limit. From these, the inventor of the present application has found out that high-precision detection can be made in a case where the tolerance of the gap S is set to a value obtained by subtracting the value of 3/2 of the length G from the value of the interval T, with the preferable value of the gap S as a median value.

In this way, according to the present current sensor 100, the plate width of the side wall portion 41 of the core 20 that can suppress an external magnetic field (for example, disturbance, such as a magnetic field from the adjacent bus bar 10B), to the minimum, and the gap E between the core 20 and the adjacent bus bar 10B can be set according to the shape of the opening portion 21 of the core 20. Additionally, since the shape of the core 20 in which the depth D from the opening portion 21 of the core 20 to the detecting element 30 becomes the minimum can be easily specified according to the shape of the opening portion 21 of the core 20, it is possible to easily design a small core 20.

Other Embodiments

It is described in the above embodiment that, since the distance between the opening portion 21 of the core 20 and the detecting element 30 becomes large by bringing the detecting element 30 close to the U-groove bottom portion 22 of the core 20, an external magnetic field can be drawn near to the core 20, thereby reducing the influence on the detecting element 30. However, the applicable scope disclosed here is not limited to this. For example, the distance between the opening portion 21 and the bus bar 10 can be increased by increasing the length from the opening portion 21 of the core 20 to the tip portion of the bottom portion 42. Thereby, since the opening portion 21 and the detecting element 30 are spaced apart, it is naturally possible to improve the shielding effect against the external magnetic field of the core 20.

It is described in the above embodiment that the core 20 is configured such that the area (cross-sectional area of the bottom portion 42) of the cross-section of the core 20 that intersects a plane parallel to the AC plane passing through the center of the bus bar 10, among constituent parts of the core 20, is wider than one area (cross-sectional area of the side wall portion 41) of the cross-section of the core 20 that intersects a plane parallel to the AB plane passing through the bus bar 10. However, the applicable scope disclosed here is not limited to this. It is also possible to make the cross-sectional area of the bottom portion 42 and the cross-sectional area of the side wall portion 41 equal to each other, and it is also possible to make the cross-sectional area of the side wall portion 41 wider than the cross-sectional area of the bottom portion 42.

Additionally, for example, in a case where chamfering is performed on an outer corner portion on the opening portion 21 side of the core 20, it is preferable that the chamfering is performed in an arc shape of a circle that has a radius that is equal to or less than half of the plate width of the core 20 in the opening portion 21. If such a configuration is adopted, the plate width of the core 20 in the opening portion 21 can be kept large. Thereby, since an external magnetic field is easily drawn near to the core 20, and an external magnetic field that reaches the detecting element 30 can be weakened, it is possible to measure a current with high precision.

It is described in the above embodiment that the bus bar 10 is cut out on the opening portion 21 side of the portion that overlaps the core 20 when the core 20 is viewed in the spacing direction B. However, the applicable scope disclosed here is not limited to this. It is also naturally possible to adopt a configuration in which the opening portion 21 side of the bus bar 10 is not cut out.

It is described in the above embodiment that the cores 20 are alternately arranged in the top view of the bus bars 10. However, the applicable scope disclosed here is not limited to this. Since a three-phase motor can be controlled if two current values among three bus bars 10 are known, cores 20 may be arranged in two among the three bus bars 10. If the cores 20 are arranged in the bus bars 10 at both ends among the three bus bars 10, it is not necessary to alternately arrange the cores.

This disclosure can be used for a current sensor that measures a current that flows through a conductor.

Therefore, aspects of this disclosure are further described below. The characteristic configuration of the current sensor related to this disclosure for achieving the above object includes at least three bus bars that are made of flat-plate-shaped conductors that connect a three-phase motor and an inverter that energizes the three-phase motor and are provided side by side along a direction parallel to the thickness of the flat plate shape; a plurality of cores in which a core is formed by stacking flat plates made of U-shaped magnetic bodies and in which each of the bus bars is inserted into the inside a U-shaped groove of the core formed by stacking the flat plates so that the face of the bus bar in a plate width direction and the face of a side wall inside the U-shaped groove of the core formed by stacking the flat plates become parallel to each other; and a detecting element that is arranged on the side of an opening portion of each of the cores so that a detection direction thereof runs along a spacing direction of the opening portion and detects the intensity of a magnetic field. The core is configured so that the interval between the core and another bus bar that is adjacent to the bus bar inserted into the U-shaped groove of the core as viewed in the axial directional of the bus bar becomes ½ of the length of the opening portion in the spacing direction. The tolerance of the gap is set to a value obtained by subtracting the value of 3/2 of the length of the opening portion in the spacing direction from the value of the interval between the bus bars that are adjacent to each other, with the gap as a median value.

According to such a characteristic configuration, an external magnetic field (for example, disturbance, such as a magnetic field from the bus bars that are provided side by side) can be suppressed to the minimum according to the shape of the opening portion of the U-shaped core, the plate thickness that is the dimension in the direction parallel to the thickness direction of the bus bar passing through the cross-section of the bus bar of the core, and the gap between the core and the adjacent bus bar can be set, the shape of the core in which the depth from the opening portion of the core to the detecting element becomes the minimum with respect to a targeted influence rate by an external magnetic field can be easily specified, the design of a small-sized core can be easily performed.

Additionally, in the above current sensor, it is preferable that the detecting element be arranged to enter a bottom portion side of the U groove that is at least equal to or more than 1.5 mm from the opening portion.

If such a configuration is adopted, the core between the opening portion and the detecting element can be made to act as a shield against an external magnetic field. That is, since an external magnetic field can be drawn near to the core until the external magnetic field reaches the detecting element, it is possible to reduce the influence of the external magnetic field.

Additionally, it is preferable that the cross-sectional area of a plane where the core intersects a plane orthogonal to the thickness direction of the bus bar passing through the center of the cross-section of the bus bar, among constituent parts of the U-shaped core, be made wider than the cross-sectional area of a plane where the core intersects a plane orthogonal to the width direction of the bus bar passing through the cross-section of the bus bar.

Here, a part that is most likely to cause magnetic saturation in the U-shaped core is the bottom portion where the magnetic flux in the core increases. On the other hand, as the cross-sectional area of the plane where the plane orthogonal to the width direction of the bus bar passing through the cross-section of the bus bar, and the core intersect each other is large, the magnetic flux of the bottom portion in the core increases. Accordingly, by making the cross-sectional area of the plane where the plane orthogonal to the width direction of the bus bar and the core intersects each other reducing until the magnetic flux density in the cross-section concerned becomes equal to the magnetic flux density in a cross-section where the plane orthogonal to the thickness direction of the bus bar passing through the center of the cross-section of the bus bar and the core intersect each other, it is possible to keep the magnetic flux density of the bottom portion low to suppress magnetic saturation while miniaturizing the core.

Additionally, it is preferable that an outer corner portion on the opening portion side of the core be chamfered in an arc shape of a circle that has a radius that is equal to or less than half of plate width that is the dimension of the opening portion in a direction parallel to the thickness direction of the bus bars of the core.

If such a configuration is adopted, the plate width of the opening portion at the upper end of the U groove of the core can be kept large. Accordingly, since an external magnetic field is easily drawn near to the core, an external magnetic field that reaches the detecting element can be weakened. That is, since the shielding effect against the external magnetic field of the core can be enhanced, it is possible to measure a current with high precision.

Additionally, it is preferable that the bus bar be cut out on the opening portion side of the portion that overlaps the core when the core is viewed in the spacing direction.

If such a configuration is adopted, it is possible to arrange the detecting element closer to the back side of the U groove of the core. Accordingly, the influence on the detecting element by the magnetic field from the adjacent bus bar can be reduced. Additionally, since the magnetic path length of the core becomes short by arranging the detecting element on the back side of the core, a demagnetizing field increases and hysteresis can also be reduced.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A current sensor comprising:
   at least three bus bars that are made of flat-plate-shaped conductors that are provided side by side along a direction parallel to the thickness of the flat plate shape;
   a plurality of cores in which a core is formed by stacking flat plates made of U-shaped magnetic bodies and in which each of the bus bars is inserted into the inside a U-shaped U groove of the core formed by stacking the flat plates so that the face of the bus bar in a plate width direction and the face of a side wall inside the U-shaped U groove of the core formed by stacking the flat plates become parallel to each other; and
   a detecting element that is arranged on the side of an opening portion of each of the cores so that a detection direction thereof runs along a spacing direction of the opening portion and detects the intensity of a magnetic field,
   wherein the core is configured so that a gap between the core and another bus bar that is adjacent to the bus bar inserted into the U groove of the core as viewed in the axial direction of the bus bar becomes ½ of the length of the opening portion in the spacing direction, and
   wherein the tolerance of the gap is set to a value obtained by subtracting the value of 3/2 of the length of the opening portion in the spacing direction from the value of the interval between the bus bars that are adjacent to each other, with the gap as a median value.

2. The current sensor according to claim 1,
   wherein the detecting element is arranged to enter a bottom portion side of the U groove that is at least equal to or more than 1.5 mm from the opening portion.

3. The current sensor according to claim 1,
   wherein the cross-sectional area of a plane where the core intersects a plane orthogonal to the thickness direction of the bus bar passing through the center of the cross-section of the bus bar, among constituent parts of the U-shaped core, is made wider than the cross-sectional area of a plane where the core intersects a plane orthogonal to the width direction of the bus bar passing through the cross-section of the bus bar.

4. The current sensor according to claim 1,
   wherein an outer corner portion on the opening portion side of the core is chamfered in an arc shape of a circle that has a radius that is equal to or less than half of plate width that is the dimension of the opening portion in a direction parallel to the thickness direction of the bus bars of the core.

5. The current sensor according to claim 1,
   wherein the bus bar is cut out on the opening portion side of the portion that overlaps the core when the core is viewed in the spacing direction.

* * * * *